United States Patent
Chen et al.

(10) Patent No.: US 8,338,929 B2
(45) Date of Patent: Dec. 25, 2012

(54) STACKED-TYPE CHIP PACKAGE STRUCTURE AND FABRICATION METHOD THEREOF

(75) Inventors: Jen-Chun Chen, Taipei County (TW); Wu-der Yang, Taoyuan County (TW)

(73) Assignee: Nanya Technology Corporation, Taoyuan (TW)

( * ) Notice: Subject to any disclaimer, the term of this patent is extended or adjusted under 35 U.S.C. 154(b) by 215 days.

(21) Appl. No.: 12/043,962

(22) Filed: Mar. 7, 2008

(65) Prior Publication Data
US 2009/0146283 A1 Jun. 11, 2009

(30) Foreign Application Priority Data
Dec. 6, 2007 (TW) ................................ 96146571 A

(51) Int. Cl.
H01L 23/02 (2006.01)

(52) U.S. Cl. ........ 257/686; 257/777; 257/678; 257/737; 257/E25.01; 438/109; 438/106; 438/127

(58) Field of Classification Search .................. 257/686, 257/777, 678, 737, E25.01; 438/109, 106, 438/127
See application file for complete search history.

(56) References Cited

U.S. PATENT DOCUMENTS

| | | | |
|---|---|---|---|
| 5,656,856 A | 8/1997 | Kweon | |
| 6,180,881 B1 * | 1/2001 | Isaak | 174/524 |
| 6,188,127 B1 | 2/2001 | Senba et al. | |
| 7,193,320 B2 * | 3/2007 | Hosoyamada et al. | 257/738 |
| 7,291,925 B2 * | 11/2007 | Han et al. | 257/777 |
| 2003/0162326 A1 * | 8/2003 | Tsubosaki et al. | 438/109 |
| 2003/0222344 A1 | 12/2003 | Hosoyamada et al. | |
| 2007/0145548 A1 * | 6/2007 | Park et al. | 257/678 |
| 2007/0176275 A1 * | 8/2007 | Singleton et al. | 257/686 |

FOREIGN PATENT DOCUMENTS

| | | |
|---|---|---|
| CN | 1355566 | 6/2002 |
| CN | 2726111 | 9/2005 |
| TW | 310082 | 7/1997 |
| TW | 200721432 | 6/2007 |

OTHER PUBLICATIONS

"1st Office Action of China counterpart application", issued on Oct. 16, 2009, p. 1-p. 3.
"2nd Office Action of China Counterpart Application", issued on Nov. 30, 2010, p. 1-p. 5, in which the listed references, CN2726111 and CN1355566 were cited.
"1st Office Action of German Counterpart Application", issued on Aug. 31, 2010, p. 1-p. 8, in which the listed references, US6180881, US20030222344 and US20030162326 were cited.
"Office Action of Taiwan Counterpart Application", issued on Jul. 14, 2011, p. 1-p. 5, in which the listed references were cited.

* cited by examiner

Primary Examiner — Junghwa M Im
(74) Attorney, Agent, or Firm — Jianq Chyun IP Office

(57) ABSTRACT

A stacked-type chip package structure in which stacked chips and stacked flexible circuit boards are disposed on a substrate. A plurality of spacer layers is respectively sandwiched between two adjacent chips and stacked on top of each other. In addition, conductive bumps are disposed on the substrate and between the stacked flexible circuit boards, such that the stacked flexible circuit boards are electrically connected to the substrate. Besides, conductive wires are electrically connected between the flexible circuit boards and the chips, so as to form a package structure with multi-layer chips on the substrate. Thereby, electrical performance and reliability of the chips are improved.

20 Claims, 5 Drawing Sheets

STACKED-TYPE CHIP PACKAGE STRUCTURE AND FABRICATION METHOD THEREOF

CROSS-REFERENCE TO RELATED APPLICATION

This application claims the priority benefit of Taiwan application serial no. 96146571, filed on Dec. 6, 2007. The entirety the above-mentioned patent application is hereby incorporated by reference herein and made a part of specification.

BACKGROUND OF THE INVENTION

1. Field of the Invention

The present invention generally relates to a chip package structure, and in particular, to a stacked-type chip package structure and a fabrication method thereof.

2. Description of Related Art

A stacked-type chip package structure is a semiconductor package structure in which a three-dimensional package technology is employed to vertically stack a plurality of chips. The stacked-type chip package structure can be applied to storage devices such as memory modules, memory cards, portable flash disks, and so forth. The memory module normally applying to a desktop computer, a notebook computer, or an industrial computer is a standardized product, such as a dynamic random access memory (DRAM) module. To satisfy computing requirements of the computers, the storage capacity and the access speed of the memory module have been continuously advanced. According to the prior art, a plurality of memory chips of a conventional single in-line memory module or a conventional dual in-line memory module is disposed on a single circuit board. By way of a surface mount technology (SMT), each pin of the memory chips is soldered to the circuit board. In addition, through an insert type surface bonding interface (e.g. a gold-finger connector) disposed on the circuit board, the memory module is inserted into a PCI bus slot on a motherboard of the computer for transmitting required information.

Nevertheless, due to a rising demand for the storage capacity of the memory module, the number of the memory chips increases accordingly, and additional area occupied by the circuit board is required. Based on the above, the memory module with a three-dimensional package structure will prevail over the conventional memory module whose storage capacity is not able to be rapidly and significantly expanded.

Most common package technologies applied to the memory module include a wire bonding technology, a flip-chip bonding technology, a package on package technology, a gold to gold interconnection (GGI) technology, a through silicon via (TSV) technology, and so on. All of the aforesaid package technologies adapted to the three-dimensional package structures are developed for meeting the requirement for the storage capacity of high-density memories.

The TSV is elaborated herein as an example. First, vias having a high aspect ratio are fabricated on a silicon substrate. A conductive material is then filled into the vias, and solder balls are formed on the silicon substrate. Thereby, the solder balls are electrically connected to the conductive material filled in the vias. Referring to FIG. 1 illustrating a stacked-type chip package structure, a plurality of chips 10 is sequentially stacked, and every two adjacent chips 10 are separated by an adhesion layer 40. A plurality of solder balls 30 is disposed between every two adjacent chips 10 and electrically connected to a conductive material 20 in vias 12 defined in and extending through each of the chips 10. Thereby, the chips 10 are electrically conducted to each other. After that, a sealant 50 can be filled between the chips 10, so as to protect the solder balls 30.

Nevertheless, fabricating the vias having a high aspect ratio on the silicon substrate is not cost-effective, and is inferior to mass production. Besides, when an arrangement of the solder balls 30 on the chips 10 follows the trend of fine pitch, the shortened distance between the solder balls 30 may give rise to an overflow of the solder balls 30 during a reflow process, which is likely to cause circuit shortage. Moreover, the fabrication of the vias having a high aspect ratio on the silicon substrate negatively affects electrical performance and reliability of integrated circuits in the chips, thus poses an impact on the operation of the entire circuit system.

SUMMARY OF THE INVENTION

The present invention is directed to a stacked-type chip package structure in which stacked flexible circuit boards and stacked chips are electrically connected to each other for forming a high-density chip package structure.

The present invention is further directed to a fabrication method of a stacked-type chip package structure in which stacked flexible circuit boards and stacked chips are disposed on a substrate for forming a high-density chip package structure.

The present invention provides a stacked-type chip package structure including a substrate, a plurality of chips, a plurality of stacked flexible circuit boards, a plurality of conductive bumps, and a plurality of conductive wires. The substrate has a first surface and a second surface. The chips and the stacked flexible circuit boards are disposed on the first surface, and a plurality of spacer layers is respectively sandwiched between two adjacent chips and stacked on top of each other. The conductive bumps disposed on the substrate and between the stacked flexible circuit boards are electrically connected to the stacked flexible circuit boards and the substrate. Besides, the conductive wires are electrically connected between each of the flexible circuit boards and each of the chips.

According to an embodiment of the present invention, the stacked flexible circuit boards include a plurality of stacked first flexible circuit boards and a plurality of stacked second flexible circuit boards.

According to an embodiment of the present invention, the conductive bumps include a plurality of first conductive bumps and a plurality of second conductive bumps. The first conductive bumps are vertically arranged between the first flexible circuit boards and electrically connected to the first flexible circuit boards, while the second conductive bumps are vertically arranged between the second flexible circuit boards and electrically connected to the second flexible circuit boards.

According to an embodiment of the present invention, the first flexible circuit boards respectively have a plurality of conductive pillars electrically connected to the first conductive bumps. In addition, the second flexible circuit boards respectively have a plurality of conductive pillars electrically connected to the second conductive bumps.

According to an embodiment of the present invention, the conductive wires include a plurality of first conductive wires and a plurality of second conductive wires. The first conductive wires are electrically connected between the first flexible circuit boards and the chips, while the second conductive wires are electrically connected between the second flexible circuit boards and the chips.

According to an embodiment of the present invention, the stacked-type chip package structure further includes a sealant formed on the substrate and encapsulating the chips, the flexible circuit boards, the conductive bumps, and the conductive wires. Besides, the stacked-type chip package structure further includes a plurality of solder balls disposed on the second surface of the substrate.

According to an embodiment of the present invention, the stacked chips have a plurality of centrally arranged wire-bonding pads. By contrast, according to another embodiment of the present invention, the stacked chips have a plurality of peripherally arranged wire-bonding pads.

In the present invention, the flexible circuit boards having the conductive pillars are sequentially stacked on the conductive bumps, and each layer of the chip and each layer of the flexible circuit boards are electrically connected to each other through the same layer of the conductive wires. As such, the package structure with multi-layer chips is formed on the substrate. The fabrication of the conductive pillars on the flexible circuit boards does not pose a negative impact on the electrical performance and reliability of the integrated circuits in the chips. Moreover, production efficiency and reliability of the products can be improved by utilizing the flexible circuit boards characterized by satisfactory reworkability and flexibility.

In order to make the aforementioned and other objects, features and advantages of the present invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 3A is a top view of the flexible circuit boards depicted in FIG. 2C, while

DESCRIPTION OF PREFERRED EMBODIMENTS

Figure 1:
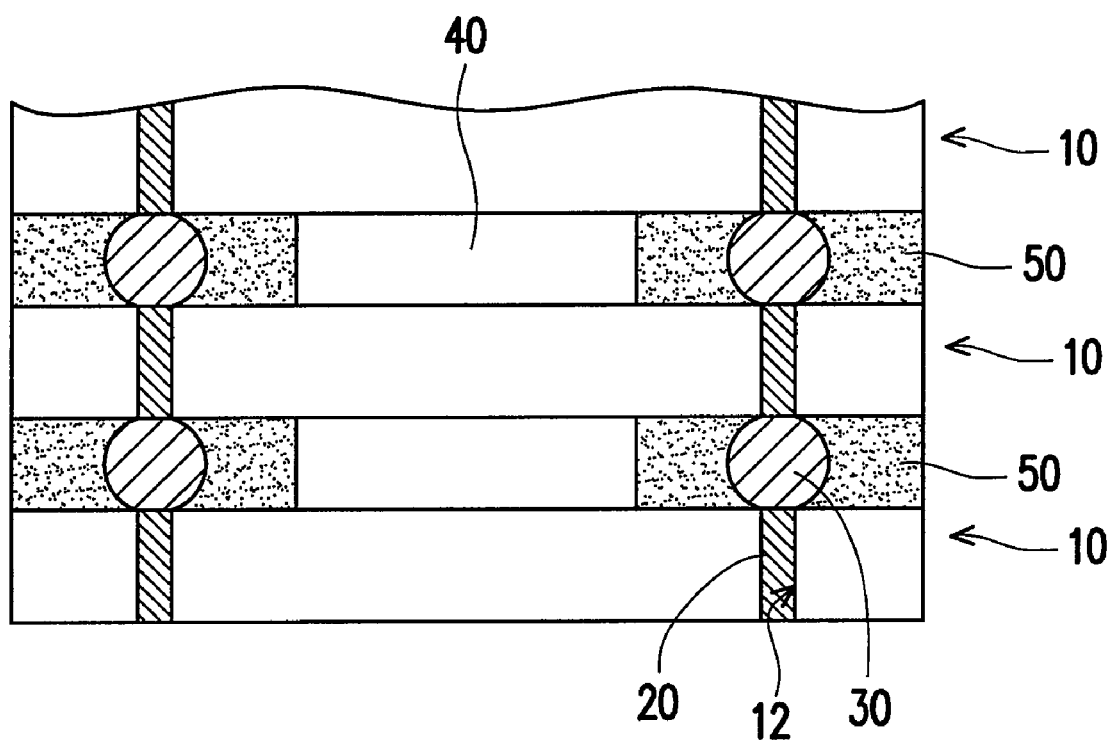
FIG. 1 is a schematic view illustrating a conventional stacked-type chip package structure.

FIGS. 2A through 2H are schematic views illustrating steps of fabricating a stacked-type chip package structure according to an embodiment of the present invention. The steps are enumerated as follows:

(a) disposing a first layer of a chip 100 on a substrate 110;

(b) disposing a first layer of conductive bumps 120 on the substrate 110 by a stud-bump bonding process;

(c) disposing a first layer of flexible circuit boards 130 on the first layer of the conductive bumps 120;

(d) forming a first layer of conductive wires 140 between the first layer of the chip 100 and the first layer of each of the flexible circuit boards 130 by a wire bonding process to electrically connect the first layer of the chip 100 and the first layer of each of the flexible circuit boards 130;

(e) disposing a second layer of conductive bumps 150 on the first layer of the flexible circuit boards 130 by the stud-bump bonding process;

(f) disposing a first layer of a spacer layer 160 on the first layer of the chip 100;

(g) disposing a second layer of a chip 170 on the first layer of the spacer layer 160;

(h) disposing a second layer of flexible circuit boards 180 on the second layer of the conductive bumps 150; and (i) forming a second layer of conductive wires 190 between the second layer of the chip 170 and the second layer of the flexible circuit boards 180 by the wire bonding process to electrically connect the second layer of the chip 170 and the second layer of the flexible circuit boards 180, so as to form a stacked-type structure 200 with two layers of the chips on the substrate 110.

Figure 2A:
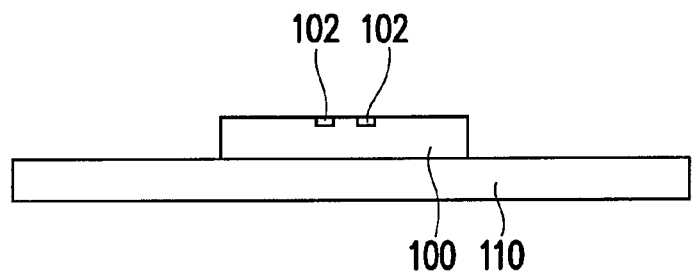
FIG. 2A through 2H are schematic views illustrating steps of fabricating a stacked-type chip package structure according to an embodiment of the present invention.

Referring to FIG. 2A, in the step (a) of the present embodiment, the first layer of the chip 100 has a back surface attached to the substrate 110, while an active surface of the chip 100 faces up. A plurality of centrally arranged wire-bonding pads 102 is disposed on the active surface of the chip 100. The wire-bonding pads 102 serve as input/output interfaces of internal circuits of the first layer of the chip 100. However, in another embodiment, the position of the wire-bonding pads 102 can be rearranged based on a redistribution layer (not shown) disposed on the active surface of the chip 100, such that a plurality of the peripherally arranged wire-bonding pads can be disposed on the active surface of the first layer of the chip 100.

Figure 2B:
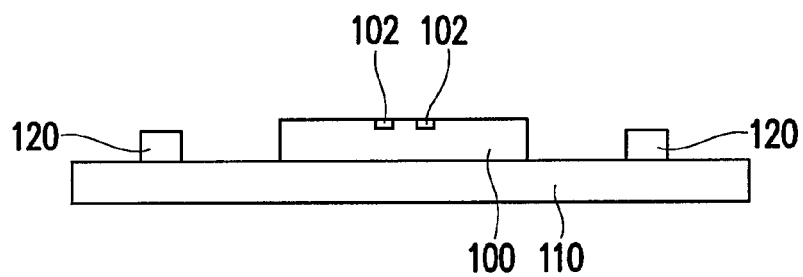

Next, referring to FIG. 2B, in the step (b) of the present embodiment, the step of disposing a plurality of the first layer of the conductive bumps 120 includes heating an end of a golden wire with use of a wire-bonding machine for forming a stud-bump which is pressed on a bonding pad of the substrate 110. Afterwards, the stud-bump is cut off from the golden wire. Said step is repeated, such that the first layer of the conductive bumps 120 is formed on each bonding pad of the substrate 110. The reliable and cost effective wire bonding machine is able to comply with the requirement of mass production. Besides, in another embodiment, the conductive bumps may be made of other materials or formed by performing other processes of fabricating the bumps.

Figure 2C:
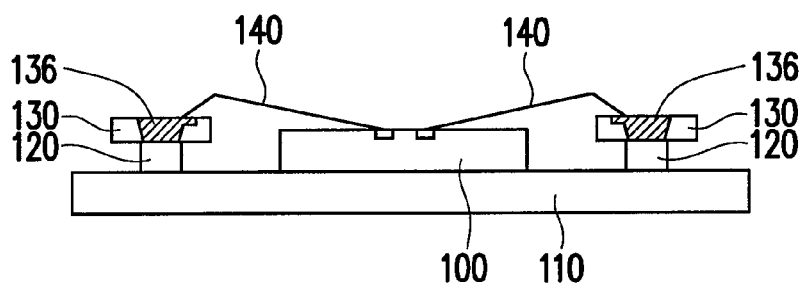
Figure 3A:
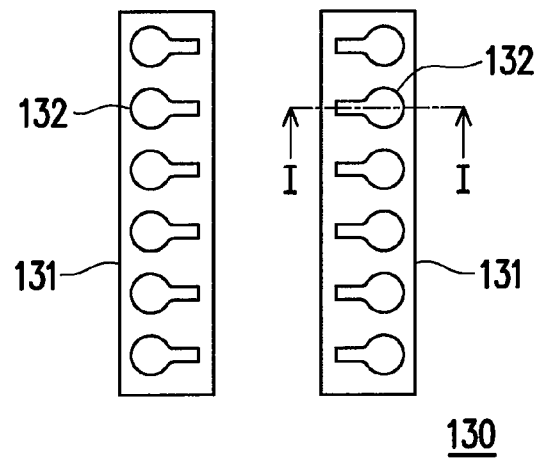
Figure 3B:
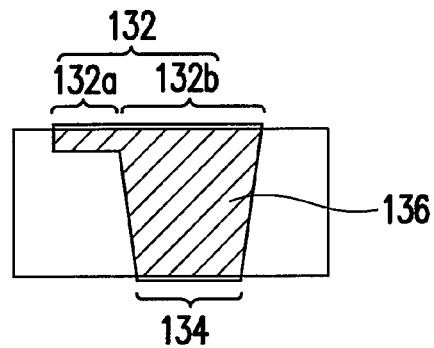
FIG. 3B is a schematic cross-sectional view along line I-I.

Thereafter, referring to FIG. 2C, in the steps (c) and (d) of the present embodiment, the first layer of the flexible circuit boards 130 having conductive pillars 136 is disposed on the first layer of the conductive bumps 120, and the first layer of the conductive wires 140 is electrically connected between the first layer of the chip 100 and the first layer of each of the flexible circuit boards 130 by the wire bonding process. In particular, the step of forming the conductive pillars 136 on the first layer of the flexible circuit boards 130 includes etching required vias on a flexible substrate (e.g. polyimide) by performing a laser drilling process or a photolithography process. After that, a conductive material is filled into the vias, and a pad material (e.g. aurum) is covered onto the conductive material. Please refer to FIGS. 2C, 3A, and 3B. FIG. 3A is a top view of the flexible circuit boards depicted in FIG. 2C, while FIG. 3B is a schematic cross-sectional view along line I-I. Each bonding pad 132 on an upper surface of a flexible substrate 131 has a bonding pad portion 132a for wire bonding and has a bonding pad portion 132b for disposing the conductive bumps thereon. The bonding pads 132 are shaped as spoons when seen from the top. Besides, each bonding pad 134 at the bottom of the flexible substrate 131 is electrically connected to the correspondingly overlaying bonding pad 132 through the conductive pillar 136 and is electrically connected to the underlying conductive bump 120. Thereby, the stacked flexible circuit boards 130 are electrically conducted to each other.

It should be noted that the cost barrier of forming the vias with a low aspect ratio on the flexible substrate is relatively low in comparison with the cost barrier of fabricating the vias with a high aspect ratio on a silicon substrate. Moreover, the available area of the silicon substrate is not occupied by the vias formed through performing the fabrication method proposed in the present embodiment. Accordingly, the maximum number of the chips sawed from each wafer is not decreased together with an increased dimension of the chips. Additionally, the fabrication of the vias on the flexible substrate does not pose a negative impact on the electrical performance and reliability of the integrated circuits in the chips. Moreover, production efficiency of the products can be improved by utilizing the flexible circuit boards characterized by reworkability and flexibility.

Figure 2D:
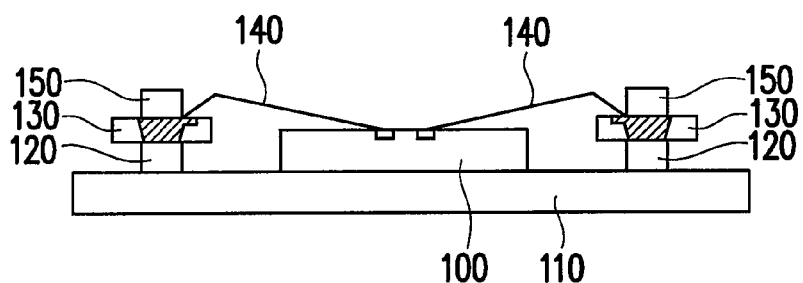

Next, referring to FIG. 2D, in the step (e) of the present embodiment, the second layer of the conductive bumps 150 is disposed on the conductive pillars 136 of the first layer of the flexible circuit boards 130 by the stud-bump bonding process. Namely, the second layer of the conductive bumps 150 is disposed on the bonding pad portions 132b above the conductive pillars 136. The bonding pad portions 132b are utilized for disposing the conductive bumps 150. As such, the first layer of the conductive bumps 120 and the second layer of the conductive bumps 150 are electrically conducted to each other.

Figure 2E:
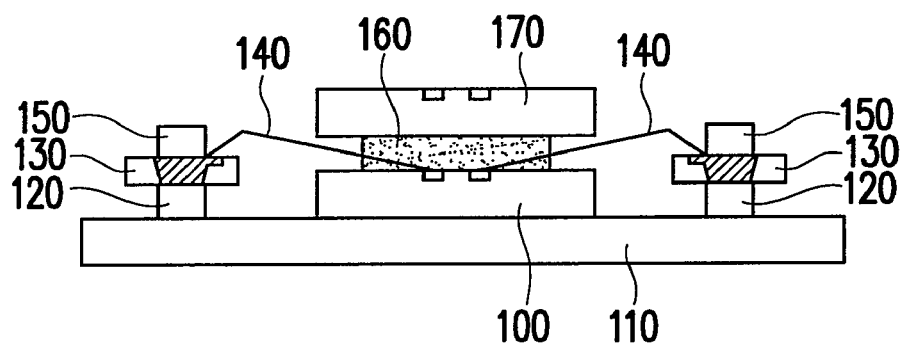

Afterwards, referring to FIG. 2E, in the steps (f) and (g) of the present embodiment, the first layer of the spacer layer 160 (e.g. epoxy resin) is disposed on the first layer of the chip 100, and the second layer of the chip 170 is disposed on the first layer of the spacer layer 160. That is to say, the first layer of the spacer layer 160 is sandwiched between the first layer of the chip 100 and the second layer of the chip 170 for maintaining the distance between the two neighboring chips. Thereby, sufficient wire bonding height of the first layer of the conductive wires 140 can be ensured, preventing the conductive wires 140 from being cracked up.

Figure 2F:
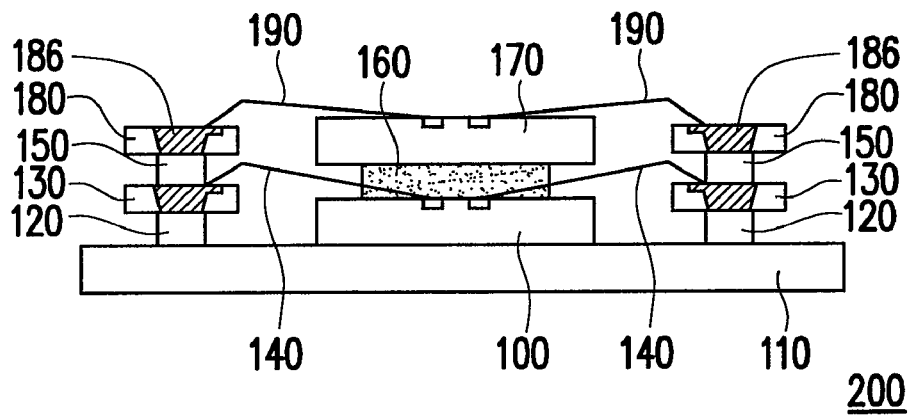

Thereafter, referring to FIG. 2F, in the steps (h) and (i) of the present embodiment, the second layer of the flexible circuit boards 180 having conductive pillars 186 is disposed on the second layer of the conductive bumps 150, and the second layer of the conductive wires 190 is electrically connected between the second layer of the chip 170 and the second layer of each of the flexible circuit boards 180 by the wire bonding process. Specifically, the conductive bumps 120 and 150 are vertically arranged on the substrate 110 and between the stacked flexible circuit boards 130 and 180. Through the electrical conduction between the stacked flexible circuit boards 130 and 180 and the stacked conductive bumps 120 and 150, the chips 100 and 170 are electrically connected to the substrate 110, so as to form the stacked-type structure 200 with two layers of the chips on the substrate 110.

Figure 2G:
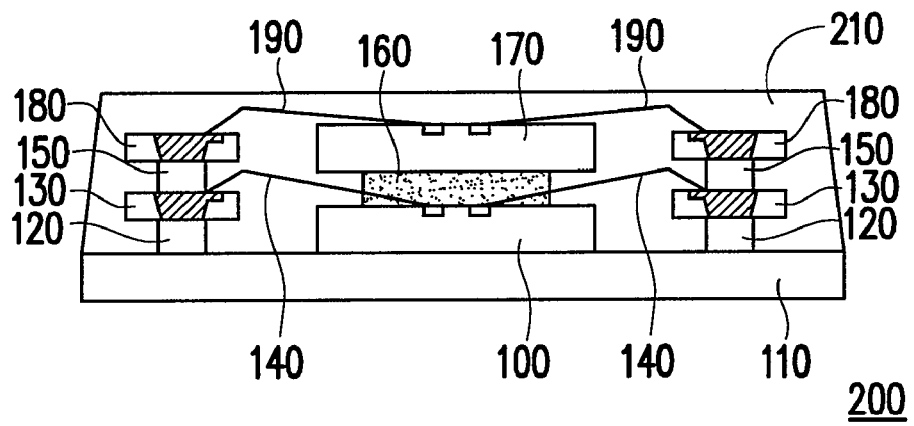
Figure 2H:
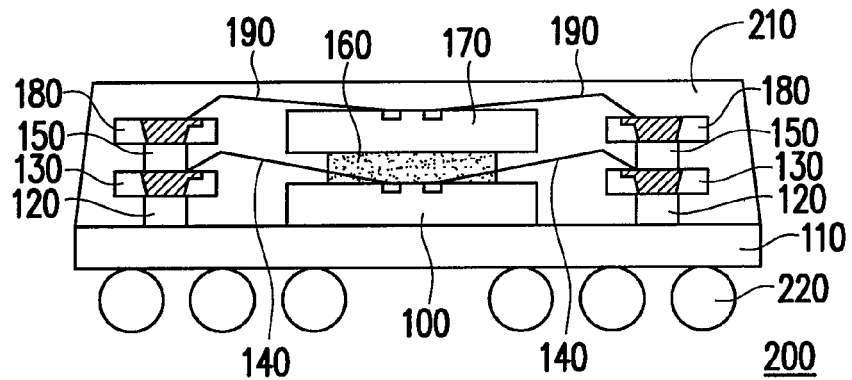

Eternally, referring to FIGS. 2G and 2H, in the present embodiment, a concave die is covered on the substrate and filled with a sealant in a liquid state. The sealant is then solidified to form and shape a sealant 210 on the substrate 110. The sealant 210 encapsulates the stacked-type structure 200 with two layers of the chips to preclude the stacked-type structure 200 from being contaminated by the external moisture. After that, a ball mounting apparatus is adopted for disposing a plurality of solder balls 220 on a lower surface of the substrate 110. Namely, the solder balls 220 are disposed on each bonding pad on the lower surface of the substrate 110. Thereafter, a reflow process is performed on the solder balls 220 to shape them up. As such, a surface bonding package process can be implemented on the substrate 110 and external circuit boards with use of the solder balls 220, so as to form a three-dimensional stacked module with multi-layer chips.

According to the present invention, not only the memory module having a stacked chip package structure with two layers of the chips can be formed, but also a plurality of stacked memory chips can be disposed in the memory module for increasing the storage capacity. The number of the memory chips can be increased based on the required storage capacity, such that a stacked-type structure with N layers of the chips is formed on the substrate. Here, N is a positive integer greater than 3. The substrate can be a carrier, such as a printing circuit board, a lead frame, and so on. Through an implementation of the SMT process, pins or the solder balls of the substrate can be soldered to the circuit board. In addition, through an insert type surface bonding interface (e.g. a goldfinger connector) disposed on the circuit board, the memory module can be inserted into a PCI bus slot on a motherboard of a computer for transmitting required information.

Figure 4:
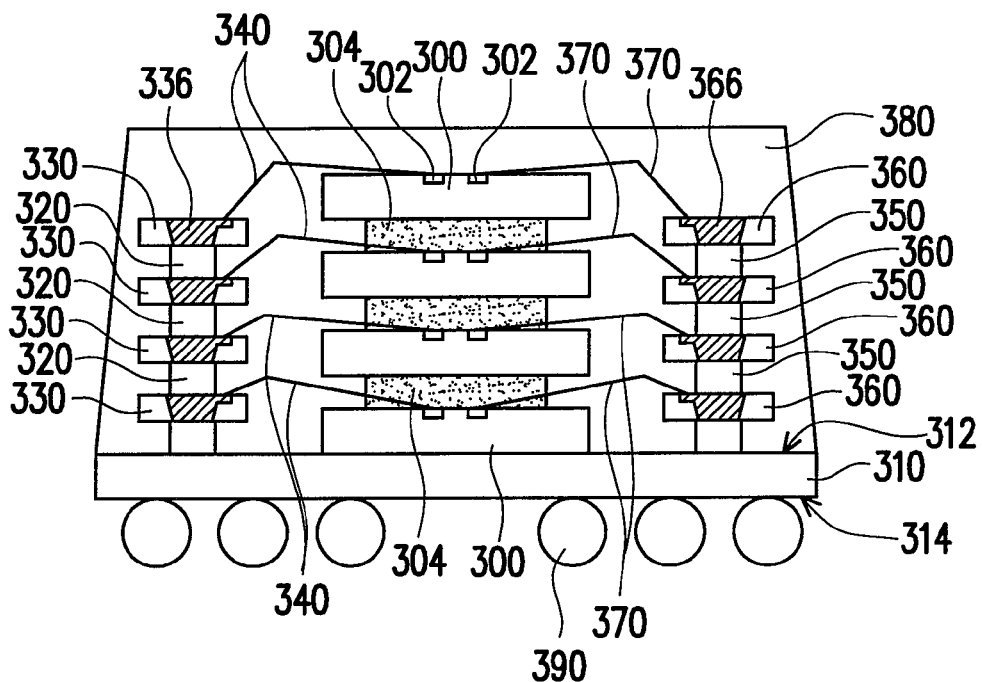
FIGS. 4 and 5 are schematic views illustrating a stacked-type chip package structure according to two respective embodiments of the present invention.
Figure 5:
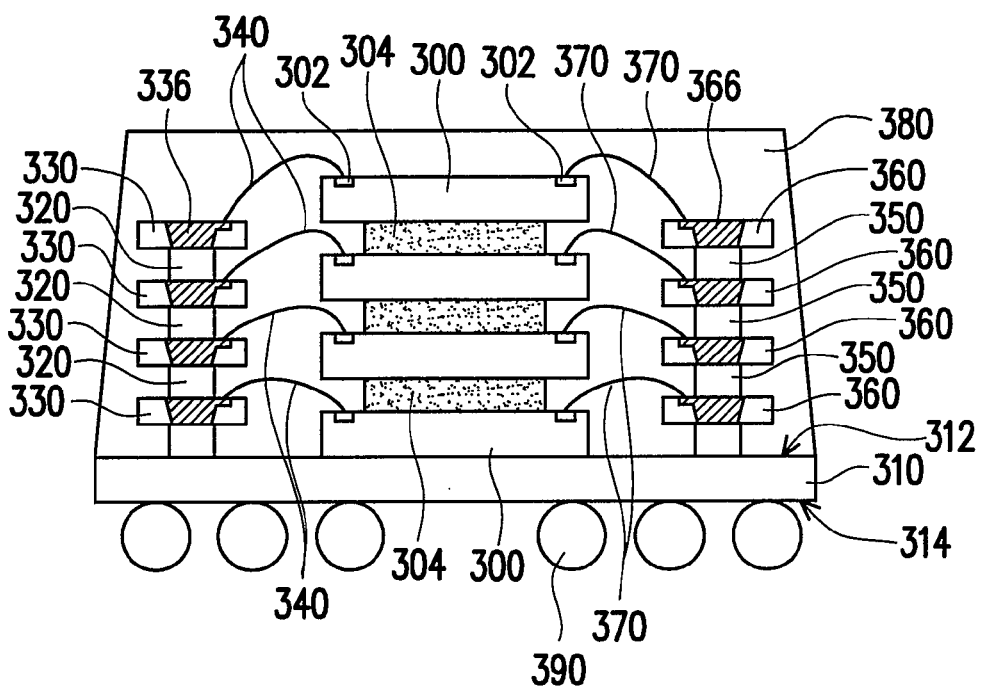

Please refer to FIGS. 4 and 5 which are schematic views illustrating a stacked-type chip package structure according to two respective embodiments of the present invention. In FIG. 4, bonding pads 302 of chips 300 are centrally arranged, and thus longer conductive wires for performing the wire bonding process are required. By contrast, as shown in FIG. 5, the bonding pads 302 of the chips 300 are disposed at peripheries of the chips 300 due to the disposition of the redistribution layer (not shown), and accordingly shorter conductive wires for performing the wire bonding process are required. In said two stacked-type chip package structures, the chips 300 are disposed on a first surface 312 (i.e. an upper surface) of a substrate 310. To satisfy the demand for the sufficient wire bonding height, spacer layers 304 are respectively sandwiched between two adjacent chips 300 and stacked on top of each other. The chips 300 are stacked in a face-to-back manner from bottom to top. In addition, a plurality of first conductive bumps 320 is vertically arranged between stacked first flexible circuit boards 330 and electrically connected to conductive pillars 336 of the stacked first flexible circuit boards 330. A plurality of second conductive bumps 350 is vertically arranged between stacked second flexible circuit boards 360 and electrically connected to conductive pillars 366 of the stacked second flexible circuit boards 360. On the other hand, a plurality of first conductive wires 340 is electrically connected between each layer of the first flexible circuit boards 330 and the chips 300, while a plurality of second conductive wires 370 is electrically connected between each layer of the second flexible circuit boards 360 and the chips 300. As such, a package structure with four layers of the chips is formed on the substrate 310. In addition, a sealant 380 is further formed on the first surface of the substrate 310 to encapsulate the package structure with four layers of the chips, so as to preclude the package structure from being contaminated by the external moisture. A plurality of solder balls 390 or other conductive structures can be further disposed on a second surface 314 (i.e. a lower surface) of the substrate 310 for performing the surface bonding package process.

In the present embodiment, the stacked flexible circuit boards include a plurality of the stacked first flexible circuit boards 330 and a plurality of the stacked second flexible circuit boards 360. The number of the first flexible circuit boards 330 is identical to the number of the chips 300, and so is the number of the second flexible circuit boards 360. Nevertheless, the stacked circuit boards are divided to more stacked circuit boards (or less stacked circuit boards) for increasing (or decreasing) the amount of inputting/outputting data according to other embodiments.

According to the present embodiment, it is observed that in the aforesaid stacked-type chip package structure and the fabrication method thereof, the first layer of the chip, the first layer of the conductive bumps, the first flexible circuit boards, the second flexible circuit boards, the first layer of the conductive wires, and the first layer of the spacer layer are sequentially disposed from bottom to top. Thereafter, the second layer of the chip, the second layer of the conductive bumps, the first flexible circuit boards, the second flexible circuit boards, and the second layer of the conductive wires are disposed. Given that the package structure with more layers of the chips is to be formed, the step (f) is repeated at least once for disposing an $(N-1)^{th}$ layer of a spacer layer on an $(N-1)^{th}$ layer of a chip. The step (g) is repeated at least once for disposing an $N^{th}$ layer of a chip on the $(N-1)^{th}$ layer of the spacer layer. The step (e) is repeated at least once for disposing a plurality of an $N^{th}$ layer of conductive bumps on an $(N-1)^{th}$ layer of flexible circuit boards by the stud-bump bonding process. The step (h) is repeated at least once for disposing an $N^{th}$ layer of flexible circuit boards on the $N^{th}$ layer of the conductive bumps. The step (i) is repeated at least once for electrically connecting an $N^{th}$ layer of conductive wires between the $N^{th}$ layer of the chip and the $N^{th}$ layer of the flexible circuit boards by the wire bonding process. Thereby, a package structure with N layers of the chips is formed on the substrate.

To sum up, in the present invention, the flexible circuit boards having the conductive pillars are sequentially stacked on the conductive bumps, and each layer of the chip and each layer of the flexible circuit boards are electrically connected to each other through the same layer of the conductive wires. As such, the package structure with multi-layer chips is formed on the substrate. Through the stacked-type chip package structure and the fabrication method thereof as proposed in the present invention, the storage capacity of the memory modules is expanded in an effective manner, the costs are reduced, and favorable electrical performance and reliability of the high-density memory modules are guaranteed. Additionally, the fabrication of the conductive pillars on the substrate does not pose a negative impact on the electrical performance and reliability of the integrated circuits in the chips. Moreover, production efficiency of the products can be improved by utilizing the flexible circuit boards characterized by satisfactory and flexibility.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A stacked-type chip package structure, comprising:
   a substrate having a first surface and a second surface;
   a first chip having a back surface and an active surface, wherein the back surface of the first chip is disposed on the first surface of the substrate in a vertical direction;
   a spacer layer covering the active surface of the first chip;
   a second chip having a back surface and an active surface, the back surface of the second chip being disposed on the spacer layer in the vertical direction, wherein the spacer layer is directly in contact with the active surface of the first chip and the back surface of the second chip;
   two first conductive bumps disposed on the first surface of the substrate and being directly in contact with the substrate;
   two first flexible circuit boards respectively disposed on and being in contact with each of the two first conductive bumps in the vertical direction, each of the two first flexible circuit boards being electrically connected to the first chip by a first conductive wire, wherein the first chip is not in direct contact with each of the two first flexible circuit boards and is separated from the two first flexible circuit boards in a horizontal direction by a first gap;
   two second conductive bumps respectively disposed on each of the two first flexible circuit boards; and
   two second flexible circuit boards respectively disposed on each of the two second conductive bumps, each of the two second flexible circuit boards being electrically connected to the second chip by a second conductive wire, wherein the second chip is not in direct contact with each of the two second flexible circuit boards and is separated from the two second flexible circuit boards in the horizontal direction by a second gap.

2. The stacked-type chip package structure as claimed in claim 1, wherein each of the two first flexible circuit boards has an upper surface and a bottom surface opposite to the upper surface, the each of the two first flexible circuit boards further comprises a first bonding pad disposed on the upper surface, and the first bonding pad is in direct contact with the corresponding second conductive bump.

3. The stacked-type chip package structure as claimed in claim 2, wherein the first bonding pad comprises a first bonding pad portion and a second bonding pad portion, the first bonding pad portion is in direct contact with the first conductive wire, and the second bonding pad portion is in direct contact with the corresponding second conductive bump.

4. The stacked-type chip package structure as claimed in claim 3, wherein a size of the first bonding pad portion is smaller than a size of the second bonding pad portion, and the first bonding pad is shaped as a spoon.

5. The stacked-type chip package structure as claimed in claim 2, wherein the each of the two first flexible circuit boards further comprises a second bonding pad disposed on the bottom surface, and the second bonding pad is in direct contact with the corresponding first conductive bump.

6. The stacked-type chip package structure as claimed in claim 5, wherein the each of the two first flexible circuit boards further comprises a via filled with a conductor material, a size of the via from the upper surface to the bottom surface is gradually reduced, and the conductor material filling the via is in direct contact with the first bonding pad and the second bonding pad.

7. The stacked-type chip package structure as claimed in claim 1, wherein the each of the two second flexible circuit boards has an upper surface and a bottom surface, the each of the two second flexible circuit boards further comprises a first bonding pad disposed on the upper surface, and the first bonding pad is in direct contact with a third conductive bump disposed on the second flexible circuit board.

8. The stacked-type chip package structure as claimed in claim 7, wherein the first bonding pad comprises a first bonding pad portion and a second bonding pad portion, the first bonding pad portion is in direct contact with the second conductive wire, and the second bonding pad portion is in direct contact with the corresponding third conductive bump.

9. The stacked-type chip package structure as claimed in claim 8, wherein a size of the first bonding pad portion is smaller than a size of the second bonding pad portion, and the first bonding pad is shaped as a spoon.

10. The stacked-type chip package structure as claimed in claim 7, wherein the each of the two second flexible circuit boards further comprises a second bonding pad disposed on the bottom surface, and the second bonding pad is in direct contact with the second conductive bumps.

11. The stacked-type chip package structure as claimed in claim 10, wherein the each of the two second flexible circuit boards further comprises a via filled with a conductor material, a size of the via from the upper surface to the bottom surface is gradually reduced, and the conductor material filling the via is in direct contact with the first bonding pad and the second bonding pad.

12. The stacked-type chip package structure as claimed in claim 1, wherein the two first flexible circuit boards are adjacent to the first chip, the two second flexible circuit boards are adjacent to the second chip, a projection area of the two first flexible circuit boards and the two second flexible circuit boards formed on the substrate does not overlap with a projection area of the first chip and the second chip formed on the substrate.

13. The stacked-type chip package structure as claimed in claim 1, further comprising one sealant formed on the substrate and entirely encapsulating the first chip, the spacer layer, the second chip, the two first conductive bumps, the two first flexible circuit boards, the two second conductive bumps, the two second flexible circuit boards, the first conductive wires, and the second conductive wires.

14. The stacked-type chip package structure as claimed in claim 1, wherein each of the two first flexible circuit boards and the second flexible circuit boards comprises a flexible substrate, a plurality of conductive pillars, and a plurality of bonding pads, the conductive pillars pass through the flexible substrate, the bonding pads are disposed on the conductive pillars, and a size of each of the conductive pillars is gradually increased away from the substrate in the vertical direction.

15. A stacked-type chip package structure, comprising:
a substrate having a first surface and a second surface;
a chip stack disposed on the first surface of the substrate in a vertical direction, the chip stack comprising a first chip, a spacer layer, and a second chip, wherein the first chip, the spacer layer, and the second chip are sequentially stacked on the first surface of the substrate, and the spacer layer is in direct contact with the first chip and the second chip; and
a flexible circuit board stack disposed on the first surface of the substrate and being in direct contact with the substrate, wherein a projection area of the flexible circuit board stack formed on the substrate does not overlap with a projection area of the chip stack formed on the substrate, the flexible circuit board stack comprises two first conductive bumps, two first flexible circuit boards, two second conductive bumps, and two second flexible circuit boards, wherein the first conductive bumps, the flexible circuit boards, the second conductive bumps, and the second flexible circuit boards are sequentially stacked on the first surface of the substrate, the chip stack is separated from the flexible circuit board stack in the horizontal direction by a gap, and the chip stack is electrically connected to the flexible circuit board stack by a plurality of conductive wires.

16. The stacked-type chip package structure as claimed in claim 15, wherein each of the two first flexible circuit boards and the second flexible circuit boards comprises a flexible substrate, a plurality of conductive pillars, and a plurality of bonding pads, the conductive pillars pass through the flexible substrate, the bonding pads are disposed on the conductive pillars, and a size of each of the conductive pillars is gradually increased away from the substrate in the vertical direction.

17. A fabrication method of a stacked-type chip package structure, comprising:
(a) disposing a first chip on a substrate;
(b) disposing two first conductive bumps on the substrate by performing a stud-bump bonding process, wherein the two first conductive bumps are located at two sides of the first chip and are not physically in contact with the first chip;
(c) disposing two first flexible circuit boards on the two first conductive bumps, respectively;
(d) forming two first conductive wires between the first chip and each of the two first flexible circuit boards by performing a wire bonding process to electrically connect the first chip and each of the two first flexible circuit boards;
(e) disposing two second conductive bumps on the two first flexible circuit boards respectively by performing the stud-bump bonding process;
(f) disposing a first spacer layer on the first chip;
(g) disposing a second chip on the first spacer layer;
(h) disposing two second flexible circuit boards on the two second conductive bumps, respectively; and
(i) forming two second conductive wires between the second chip and each of the two second flexible circuit boards by performing the wire bonding process to electrically connect the second chip and each of the two second flexible circuit boards, so as to form the stacked-type structure with two layers of the chips on the substrate.

18. The fabrication method of the stacked-type chip package structure as claimed in claim 17, further comprising:
forming a sealant on the substrate and entirely encapsulating the stacked-type structure with two layers of the chips on the substrate with the sealant.

19. The fabrication method of the stacked-type chip package structure as claimed in claim 17, further comprising:
forming a stacked-type structure with N layers of the chips on the substrate, wherein N is a positive integer equal to or greater than 3.

20. The fabrication method of the stacked-type chip package structure as claimed in claim 19, further comprising:
repeating the step (e) at least once for disposing an $(N-1)^{th}$ spacer layer on an $(N-1)^{th}$ chip;
repeating the step (f) at least once for disposing an $N^{th}$ chip on the $(N-1)^{th}$ spacer layer;
repeating the step (g) at least once for disposing two $N^{th}$ conductive bumps on two $(N-1)^{th}$ two flexible circuit boards by performing the stud-bump bonding process;
repeating the step (h) at least once for disposing two $N^{th}$ layer of flexible circuit boards on the two $N^{th}$ layer of the conductive bumps; and
repeating the step (i) at least once for electrically connecting two $N^{th}$ layer of conductive wires between the $N^{th}$ chip and each of the two $N^{th}$ flexible circuit boards by performing the wire bonding process.

* * * * *